United States Patent [19]

Aisou

[11] Patent Number: 5,677,242
[45] Date of Patent: Oct. 14, 1997

[54] PROCESS OF FABRICATING SEMICONDUCTOR INTEGRATED CIRCUIT DEVICE HAVING SMALL GEOMETRY CONTACT BY USING SPACER ON PHOTORESIST MASK

[75] Inventor: Fumiki Aisou, Tokyo, Japan

[73] Assignee: NEC Corporation, Tokyo, Japan

[21] Appl. No.: 586,279

[22] Filed: Jan. 16, 1996

[30] Foreign Application Priority Data

Jan. 13, 1995 [JP] Japan .................. 7-020946

[51] Int. Cl.$^6$ .................................. H01L 21/44
[52] U.S. Cl. .................. 437/195; 437/191; 437/228; 437/229; 156/659.11
[58] Field of Search .................. 437/195, 191, 437/228 CON, 228 SW, 245, 229; 156/659.11

[56] References Cited

U.S. PATENT DOCUMENTS

| | | |
|---|---|---|
| 4,707,218 | 11/1987 | Giammarco et al. .......... 156/643.1 |
| 4,801,350 | 1/1989 | Mattox et al. . |
| 4,857,477 | 8/1989 | Kamamori ................... 437/47 |
| 5,279,990 | 1/1994 | Sun et al. ................... 437/195 |
| 5,334,552 | 8/1994 | Homma ...................... 437/195 |
| 5,444,021 | 8/1995 | Chung et al. ................ 437/195 |

FOREIGN PATENT DOCUMENTS

| | | |
|---|---|---|
| 1-110727 | 8/1989 | Japan . |
| 4-793321 | 3/1992 | Japan . |
| 4-79321 | 3/1992 | Japan . |
| 4-94536 | 3/1992 | Japan . |

*Primary Examiner*—John Niebling
*Assistant Examiner*—C. Everhart
*Attorney, Agent, or Firm*—Sughrue, Mion, Zinn, Macpeak and Seas

[57] ABSTRACT

A first opening formed in a photo-resist layer is topographically covered with a spacer layer of silicon oxide so as to define a second opening narrower than the first opening, and the spacer layer and a target layer of silicon oxide thereabeneath are anisotropically etched so as to form a contact hole narrower than the first opening in the target layer.

17 Claims, 14 Drawing Sheets

PROCESS OF FABRICATING SEMICONDUCTOR INTEGRATED CIRCUIT DEVICE HAVING SMALL GEOMETRY CONTACT BY USING SPACER ON PHOTORESIST MASK

FIELD OF THE INVENTION

This invention relates to a process of fabricating a semiconductor integrated circuit device and, more particularly, to a process of fabricating a semiconductor integrated circuit device having a small geometry contact.

DESCRIPTION OF THE RELATED ART

Circuit components of a semiconductor integrated circuit device have been progressively miniaturized, and, accordingly, a large number of the circuit components are integrated on a small semiconductor chip. The circuit components are electrically connected through wirings, and the wiring arrangement is getting more and more intricate. The miniature circuit components connected through the intricate wiring arrangement require narrow contact holes.

A typical example of the prior art process for forming a narrow pattern is disclosed in Japanese Patent Publication of Unexamined Application No. 4-79321, and FIGS. 1A to 1E illustrates the prior art process sequence.

According to the Japanese Patent Publication of Unexamined Application, the prior art process starts with preparation of a p-type silicon substrate 1 ranging from 10 ohm-cm to 15 ohm-cm in resistivity. The p-type silicon substrate 1 is thermally oxidized in moisture atmosphere at 950 degrees centigrade, and silicon dioxide layer 2 is grown on the p-type silicon substrate 1 to 6000 angstroms thick.

Subsequently, photo-resist is spread over the entire surface of the silicon dioxide layer 2, and the photo-resist layer is formed into a photo-resist mask 3 through the lithography. G-ray of 436 nanometer wavelength is radiated through a modified illumination system with the numerical aperture of 0.54 to the photo-resist layer, and an opening 6a of 0.6 micron in diameter is formed in the photo-resist layer through a development as shown in FIG. 1A.

Using the photo-resist mask 3, the silicon dioxide layer 2 is anisotropically etched, and the opening 6a is transferred to the silicon dioxide layer 2. As a result, an opening 2a of 0.6 micron in diameter is formed in the silicon dioxide layer 2.

The photo-resist mask 3 is stripped off, and silicon oxide is uniformly deposited to 1000 angstroms thick on the entire surface of the structure by using a chemical vapor deposition. The silicon oxide layer 3 topographically extends on the silicon dioxide layer 2 and the silicon substrate 1 exposed to the opening 2a as shown in FIG. 1B.

The silicon oxide layer 3 is etched back by using an anisotropical dry etching, and remains on the inner surface of the silicon dioxide layer 2 defining the opening 2a as shown in FIG. 1C. Thus, a side wall 3a is formed from the silicon oxide layer 3, and decreases the opening 2a to 0.4 micron in diameter.

The silicon dioxide layer 2 and the side wall 3a form in combination an etching mask for the p-type silicon substrate 1. The p-type silicon substrate 1 is subjected to an anisotropical dry etching, and a groove 1a is formed in the surface portion of the p-type silicon substrate 1 as shown in FIG. 1D. The groove 1a is 0.4 micron in diameter and 3 microns in depth.

Finally, the silicon dioxide layer 2 and the side wall 3a is removed, and the groove 1a is exposed to the major surface of the p-type silicon substrate 1 as shown in FIG. 1E.

Thus, the side wall 3a narrows the opening 2a. If the opening 6a has the minimum dimensions transferrable through the lithography, the side wall 3a makes the opening 2a smaller than the minimum geometry, and causes the groove 1a to be smaller than a groove simply transferred through the lithography.

The prior art pattern transfer technology shown in FIGS. 1A to 1E may be available for a small geometry contact formed in an inter-level insulating layer. The modified pattern transfer process is constituted by the steps shown in FIGS. 1A to 1C. However, the anisotropical etching on the silicon dioxide layer 2 is carried out by using the photo-resist mask without shrinkage of a pattern transferred through the lithography, and, accordingly, is liable to expose a conductive layer forming a part of an integrated circuit. If the conductive layer is exposed to the etchant gas, the etching gas damages the conductive layer.

Assuming now that the integrated circuit is a dynamic random access memory device, the small geometry contact is formed in the inter-level insulating layer for exposing a drain region of a switching transistor, and the lateral distance between the drain region and a gate electrode is extremely small. The modified process transfers the pattern image of a contact hole to the photo-resist layer 2 without shrinkage, and the anisotropical etching forms a hole as wide as the pattern image. As a result, the gate electrode is liable to be exposed to the hole, and the etchant gas tends to damage the gate electrode. Thus, the etchant gas degrades the transistor characteristics.

Even though the side wall 3a prevents the gate electrode from a short-circuit to the drain contact, the damaged gate electrode is left over the channel region, and a malfunction takes place.

As will be understood, it is necessary for a small geometry contact hole to shrink the pattern before the etching, and the prior art pattern transfer technology shown in FIGS. 1A to 1C is not appropriate for a miniature contact hole.

One of the pattern transfer technology available for the miniature contact hole is disclosed in U.S. Pat. No. 5,279,990, and FIGS. 2A to 2E illustrate the second prior art process for forming a small geometry contact hole disclosed in the U.S. Patent.

According to FIG. 2A, a lightly doped p-type silicon substrate 11 is overlain by an inter-level insulating layer 12. First, polysilicon is deposited to 400 nanometers thick on the inter-level insulating layer 12 by using a low pressure chemical vapor deposition, so that the inter-level insulating layer 12 is overlain by the polysilicon layer 13.

Subsequently, silicon oxide is deposited to 150 nanometers thick on the polysilicon layer 13 by using a normal pressure chemical vapor deposition or a plasma-assisted chemical vapor deposition, so that the polysilicon layer 13 is overlain by the silicon oxide layer 14.

Photo-resist solution is spread over the entire surface of the silicon oxide layer 14, and a photo-resist layer is provided over the silicon oxide layer 14 through a baking. If a contact pattern on a reticle is 400 nanometer in diameter, the contact pattern image is transferred to the photo-resist layer 15, and the photo-resist layer 15 becomes partially soluble. When the contact pattern image is developed, a hole 15a is formed in the photo-resist layer, and the hole 15a is also 400 nanometers in diameter.

Using the photo-resist layer 15 as an etching mask, the silicon oxide layer 14 is partially removed by using a dry etching, and a hole 14a is formed in the silicon oxide layer 14 a shown in FIG. 2a. The contact pattern image is transferred to the silicon oxide layer 14, and the polysilicon layer 13 is partially exposed to the holes 14a and 15a.

The photo-resist layer 15 is stripped off, and the polysilicon layer 13 exposed to the hole 14a is etched away. As a result, a hole 13a is formed in the polysilicon layer 13, and the contact pattern image is transferred from the silicon oxide layer 14 to the polysilicon layer 13 as shown in FIG. 2B.

Subsequently, polysilicon is deposited to 150 nanometers thick by using the low-pressure chemical vapor deposition, and the polysilicon layer 16 extends over not only the upper surface of the silicon oxide layer 14 but also the side/bottom surfaces defining the holes 13a and 14a as shown in FIG. 2C. The polysilicon layer 16 narrows the holes 13a and 14a.

The polysilicon layer 16 is uniformly etched, and a side wall 16a of the polysilicon is left on the side surface defining the hole 13a. The side wall 16a is merged with the polysilicon layer 13, and defines a secondary hole 16b narrower than the hole 13a as shown in FIG. 2D.

Using the side wall 16a merged with the polysilicon layer 13 as an etching mask, the inter-level insulating layer 12 is partially removed so as to form a contact hole 12a as shown in FIG. 2E, and the contact hole 12a has the diameter of the order of 250 nanometers.

Thus, the second prior art process etches the inter-level insulating layer 12 as narrow as the contact hole 12a. For this reason, even if a conductive layer is embedded in the inter-level insulating layer 12 in the vicinity of the contact hole 12a, the conductive layer is not exposed to the contact hole 12a. The second prior art process shown in FIGS. 2A to 2E is hereinbefore referred to as "polysilicon side wall process".

Another prior art process is disclosed in Japanese Patent Publication of Unexamined Application No. 4-94536, and FIGS. 3A to 3D illustrates the third prior art process hereinbelow referred to as "oblique deposition process".

The third process starts with preparation of a silicon substrate 21 overlain by a photo-resist structure 22. The photo-resist structure 22 includes a lower photo-resist layer of 8000 angstroms thick, a silicon dioxide layer 22b of 3000 angstroms thick and an upper photo-resist layer 22c ranging between 2000 angstroms to 6000 angstroms thick.

First, an opening 22d is formed in the upper photo-resist layer 22c through a lithography, and is 0.5 micron in width. The resultant structure is illustrated in FIG. 3A.

Subsequently, aluminum is obliquely deposited through a vacuum evaporation on the exposed surface of the photo-resist structure 22. In this instance, the aluminum is deposited at 45 degrees with respect to the upper surface of the upper photo-resist layer 22c, and is grown to 1000 angstroms thick. An aluminum layer 23 covers a part of the upper photo-resist layer 22c and a part of the silicon dioxide layer 22b exposed to the opening 22d. However, the aluminum is never deposited on a shadow 22e of the upper photo-resist layer 22c as shown in FIG. 3B. The aluminum layer 23 in the opening 22d serves as a kind of side wall.

Subsequently, the silicon dioxide layer 22b is anisotropically etched through a reactive ion etching using $CF_4$, and the lower photo-resist layer 22a is partially removed through a reactive ion etching using $O_2$. As a result, a hole 22f is formed in the silicon dioxide layer 22b and the lower photo-resist layer 22a as shown in FIG. 3C.

The aluminum side wall withstands the reactive etchings, and prevents the silicon dioxide therebeneath from the etchant, and, for this reason, the hole 22f is narrower than the opening 22d formed in the upper photo-resist layer 22c.

The aluminum layer 23 is etched away by using $Cl_2$, the reactive etching using $O_2$ removes the upper photo-resist layer 22c, and the silicon oxide layer 22b is etched away in $CF_4$. As a result, the lower photo-resist layer 22a with the narrow hole 22f is left on the silicon substrate 21 as shown in FIG. 3D.

If the photo-resist structure 22 is provided on an inter-level insulating layer, a contact hole as narrow as the hole 22f is formed in the inter-level insulating layer, and a conductive layer such as a gate electrode is not exposed to the contact hole as similar to the second prior art process.

However, the prior art polysilicon side wall process and the prior art oblique deposition process encounter a problem in complexity, and the complicated prior art processes increase the production cost of a semiconductor integrated circuit device.

In detail, the prior art polysilicon side wall process requires the three-layer mask structure, i.e., the polysilicon layer 13, the silicon oxide layer 14 and the photo-resist layer 15 over the inter-level insulating layer 12 to be finally patterned, and the side wall 16a is formed through the deposition of polysilicon and the anisotropical etching. The three-layer mask structure 13/14/15 requires the chemical vapor deposition repeated twice and the resist coating, and the side wall 16a further requires the chemical vapor deposition and the anisotropical etching. The chemical vapor deposition, the resist coating and the anisotropical etching make the prior art polysilicon side wall process complicated.

The prior art oblique deposition process also requires the three-level mask structure 22, i.e., the lower photo-resist layer 22a, the silicon dioxide layer 22b and the upper photo-resist layer 22c over a target layer to be finally patterned, and the aluminum side wall is formed through the oblique vacuum evaporation. The three-level mask structure 22 requires the resist coating repeated twice and the chemical vapor deposition, and the aluminum side wall requires the oblique deposition. These resist coatings, the chemical vapor deposition and the oblique evaporation make the prior art oblique deposition process complicated.

The prior art oblique deposition process further has a problem in that the oblique evaporation deviates the hole 22f, and requires a precise forecast for the contact hole. Moreover, the aluminum reacts with the fluorine during the etching, and the insulating reactant increases the electric resistance of a plug filling the contact hole.

SUMMARY OF THE INVENTION

It is therefore an important object of the present invention to provide a process of fabricating a semiconductor device which is simple without an exposure of a component to an etchant.

To accomplish the object, the present invention proposes to directly narrow a pattern of a photo-resist layer with a spacer layer.

In accordance with the present invention, there is provided a process of fabricating a semiconductor device, comprising the steps of: a) preparing a target layer of a first material to be patterned; b) forming a photo-resist layer on the target layer; c) transferring a pattern to the photo-resist layer so as to form at least one first opening defined by an inner surface of the photo-resist layer and exposing a part of the target layer; d) depositing a spacer layer of a second material so as to cover an upper surface of the photo-resist layer, the inner surface of the photo-resist layer and the part of the target layer, the spacer layer defining a cavity narrower than the at least one opening; and e) exposing the spacer layer to a first anisotropical etchant having little selectivity between the first material and the second material so as to form a second opening in the target layer smaller in area than the at least one first opening.

The first material may be identical with the second material.

BRIEF DESCRIPTION OF THE DRAWINGS

The features and advantages of the process according to the present invention will be more clearly understood from the following description taken in conjunction with the accompanying drawings in which.

DESCRIPTION OF THE PREFERRED EMBODIMENTS

First Embodiment

Figure 1A:
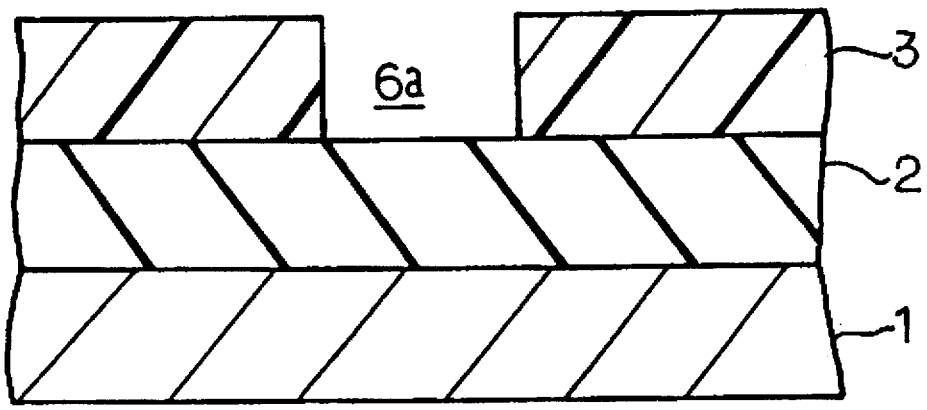
FIGS. 1A to 1E are cross sectional views showing the first prior art process sequence for forming a small geometry contact hole.
Figure 1B:
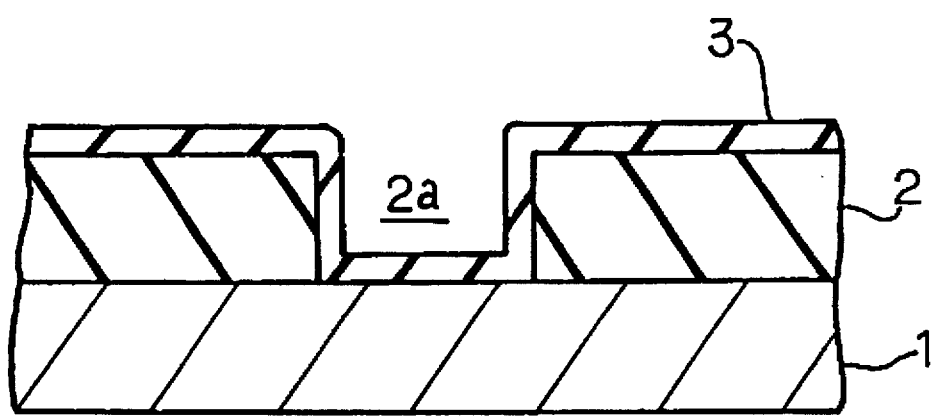
Figure 1C:
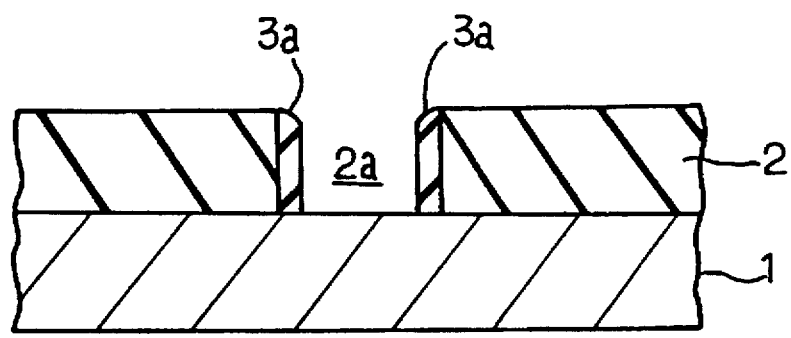
Figure 1D:
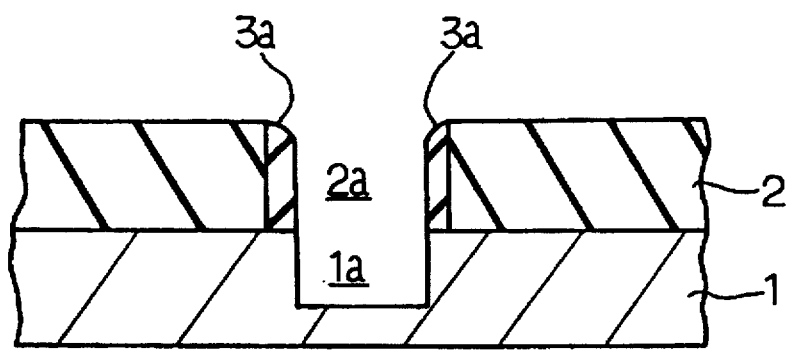
Figure 1E:
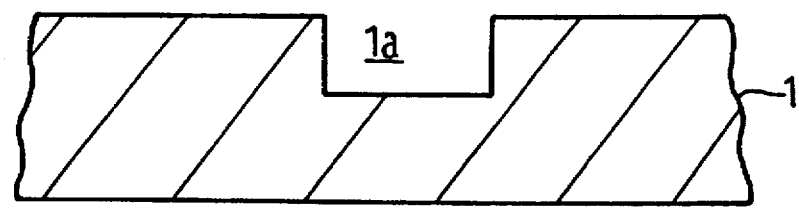
Figure 2A:
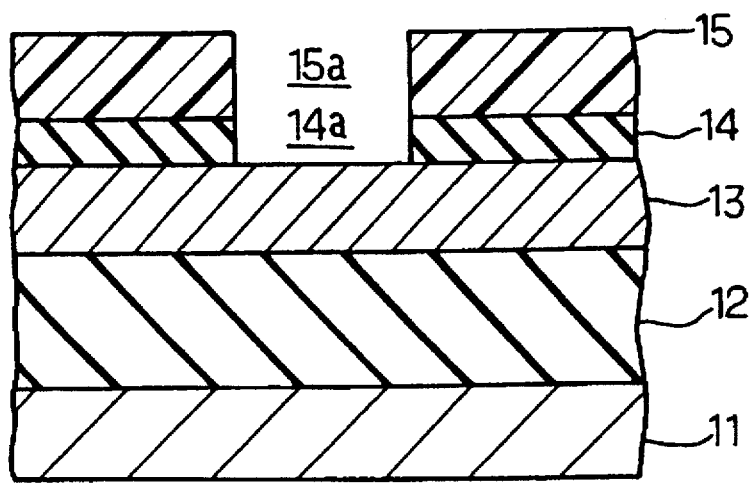
FIGS. 2A to 2E are cross sectional views showing the prior art polysilicon side wall process disclosed in U.S. Pat. No. 5,279,990.
Figure 2B:
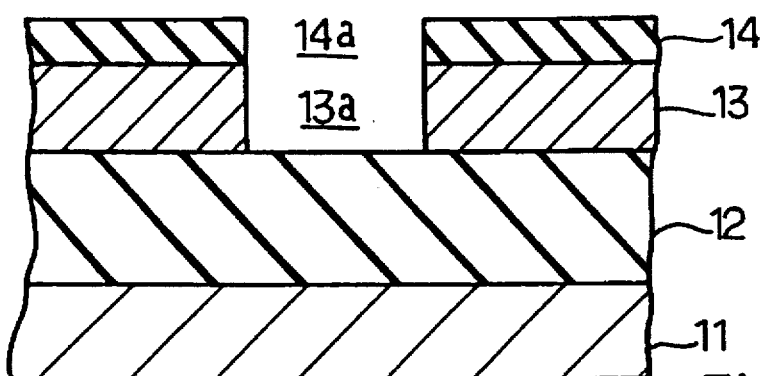
Figure 2C:
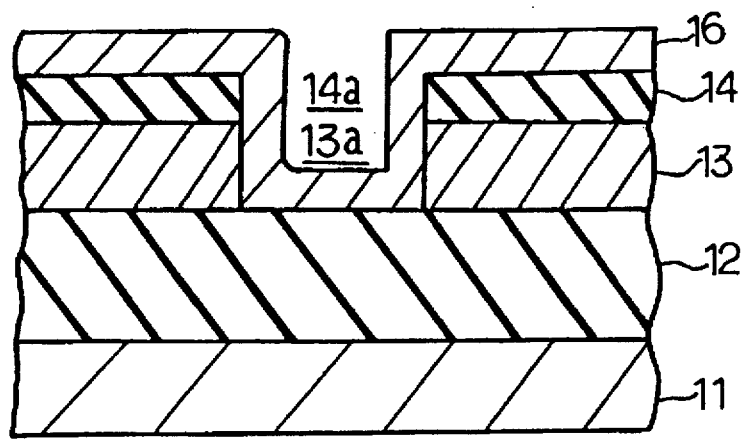
Figure 2D:
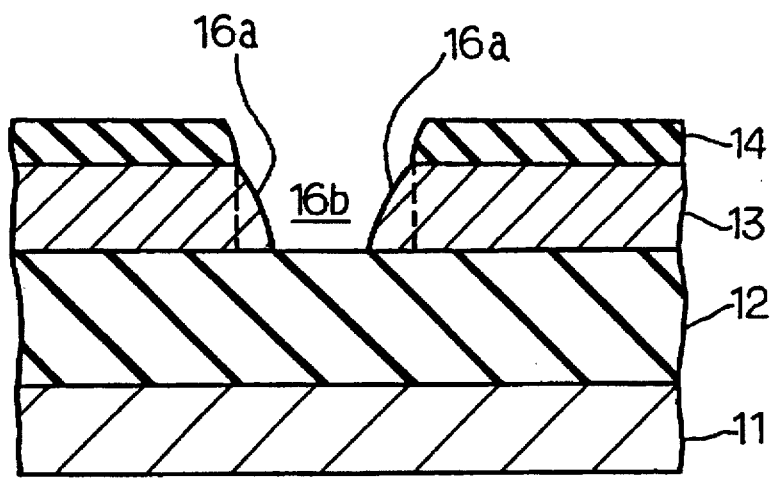
Figure 2E:
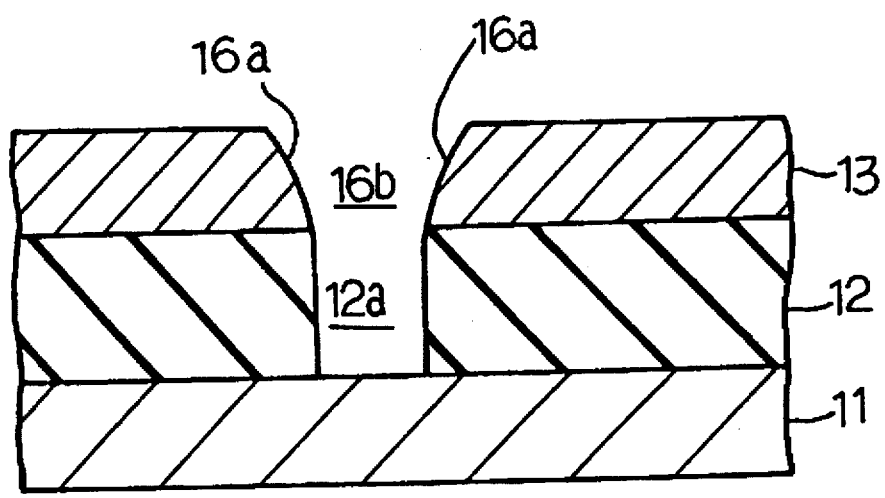
Figure 3A:
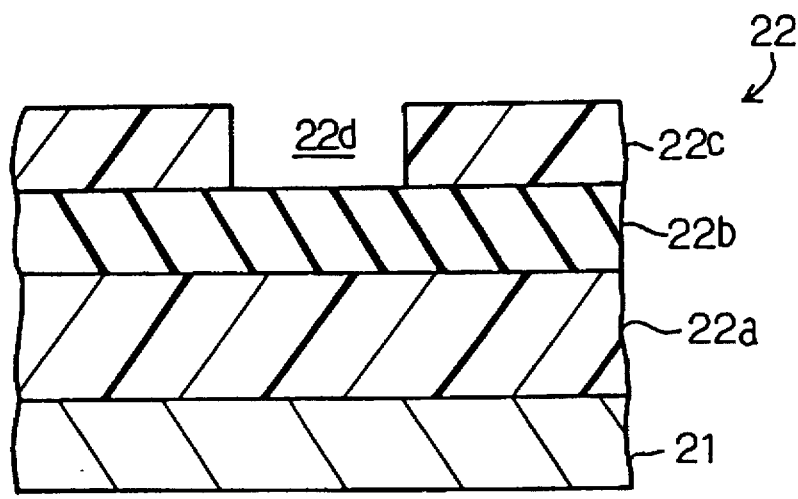
FIGS. 3A to 3D are cross sectional views showing the prior art oblique deposition process disclosed in Japanese Patent Publication of Unexamined Application No. 4-94536.
Figure 3B:
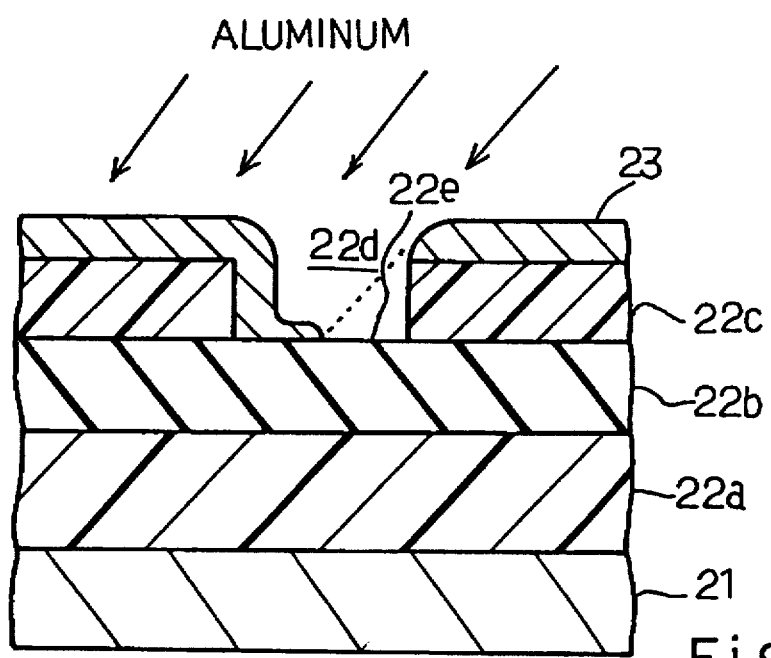
Figure 3C:
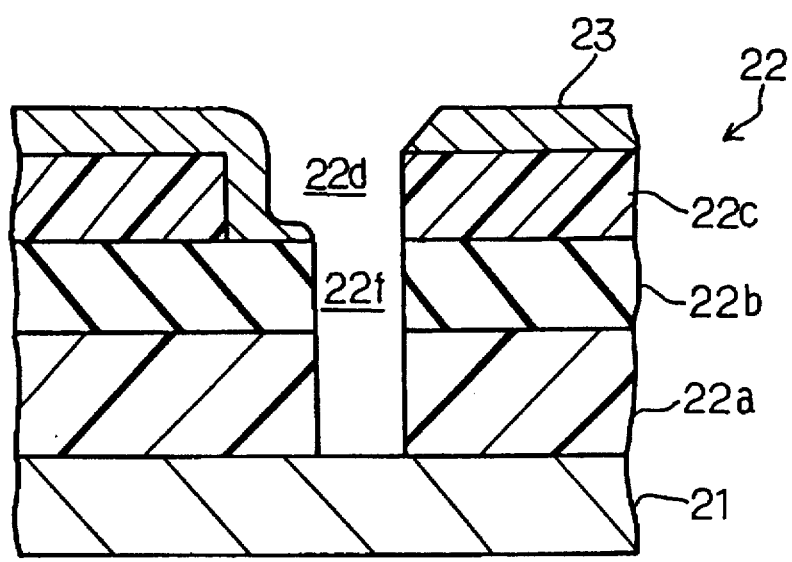
Figure 3D:
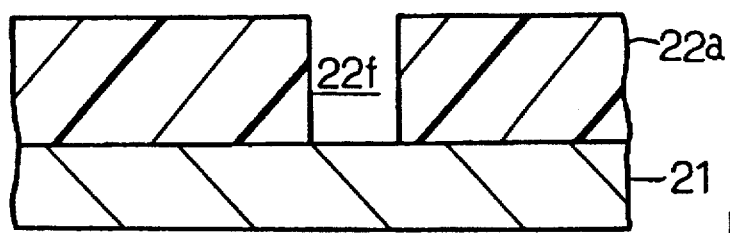

FIGS. 4A to 4D illustrate essential steps of a process for forming a semiconductor integrated circuit device. The process starts with preparation of a semiconductor substrate 31 such as, for example, a single crystal silicon substrate, and field effect transistors 32 are formed on the semiconductor substrate 31. Namely, a field oxide layer (not shown) is selectively grown on the major surface of the semiconductor substrate 31, and gate oxide layers 32a are thermally grown on the exposed major surface. Conductive film structure is formed over the entire surface, and is patterned into gate electrodes 32b. Dopant impurity is ion implanted into the gate electrodes 32b and the exposed major surface, and source and drain regions 32c are formed in the exposed major surface in a self-aligned manner with the gate electrodes 32b. Thus, the field effect transistors 32 are fabricated on the semiconductor substrate 31.

Silicon oxide is deposited to 1 micron on the entire surface of the structure, and the field effect transistors 32 and the exposed major surface are covered with an inter-level insulating layer 33 of 1 micron thick. In this instance, the inter-level insulating layer 33 serves as a target layer.

Photo-resist is spread over the upper surface of the inter-level insulating layer 33, and is baked so as to form a photo-resist layer 34 of 1 micron thick. In this instance, the photo-resist layer 34 is approximately equal in thickness to the inter-level insulating layer 33, and the resist pattern is exactly transferred to the inter-level insulating layer 33 in the later stage. However, the exact pattern transfer is achieved in so far as the photo-resist layer 34 is not widely different in thickness from the inter-level insulating layer 33.

Figure 4A:
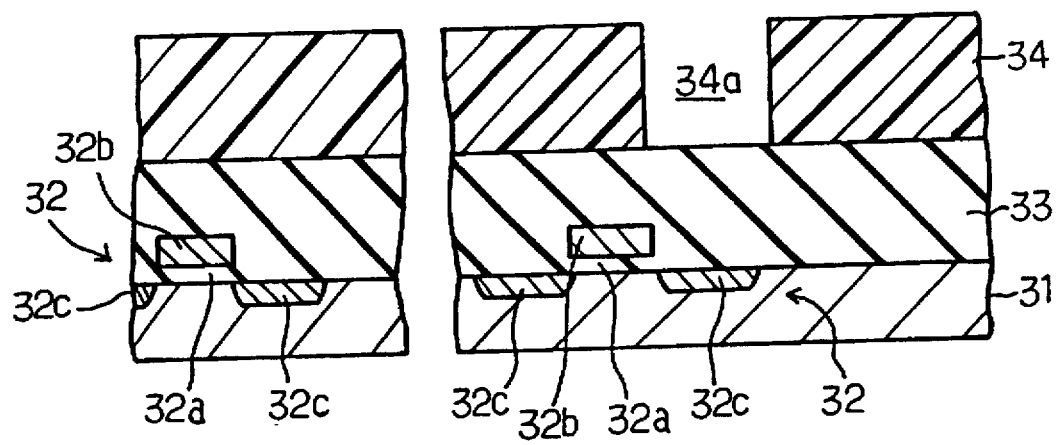
FIGS. 4A to 4D are cross sectional views showing a process sequence according to the present invention.

The resultant structure is placed in an aligner (not shown), and a transparent pattern on a reticle (not shown) is transferred to the photo-resist layer 34. The transparent pattern contains an image of a contact hole. When the pattern image transferred to the photo-resist layer 34 is developed, an opening 34a is formed in the photo-resist layer 34 as shown in FIG. 4A, and is 450 nanometers in diameter in this instance. The opening 34a exposes a part of the inter-level insulating layer 33 over one of the source and drain regions 32c.

Figure 5:
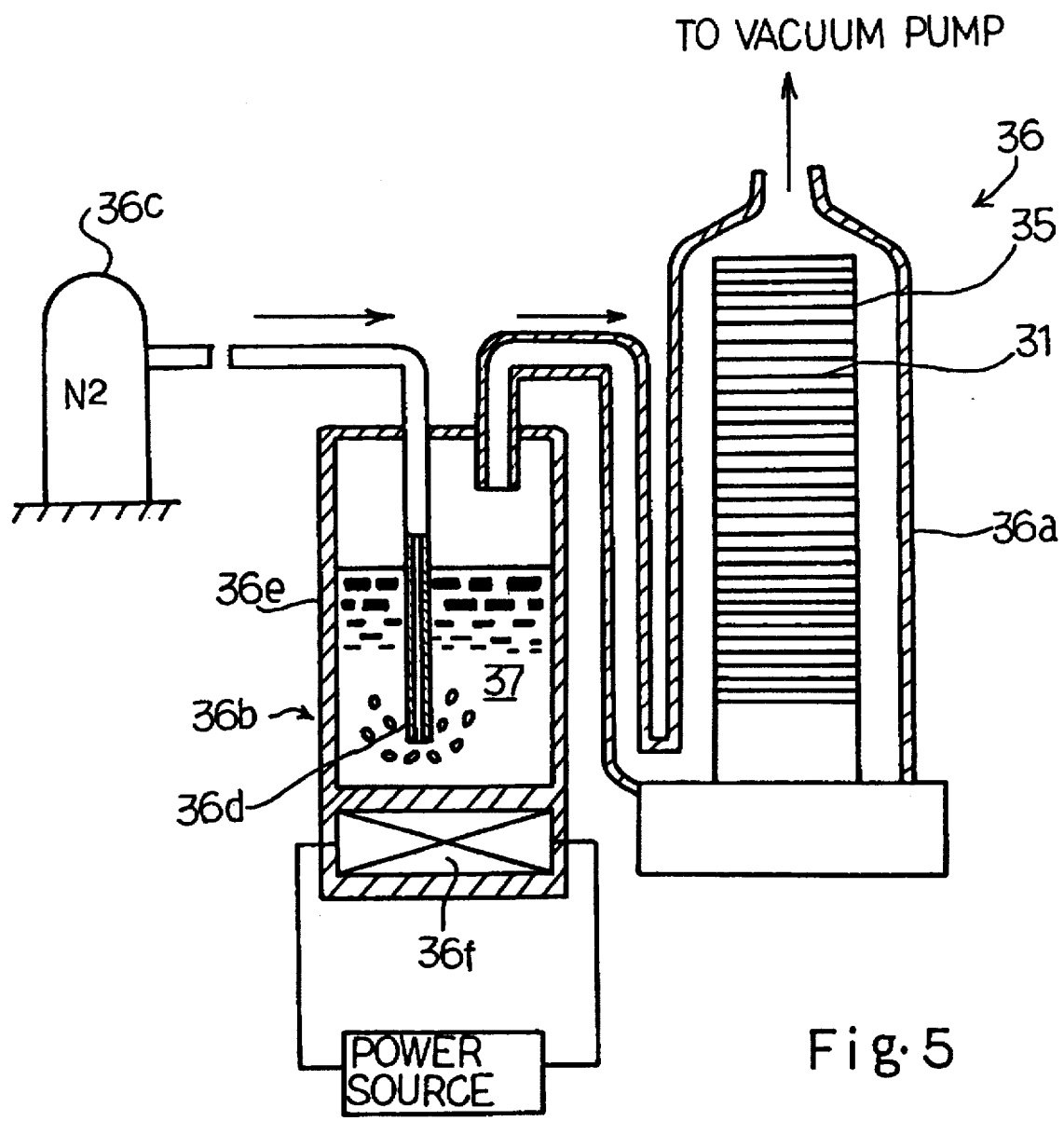
FIG. 5 is a schematic view showing a chemical vapor deposition system used in the process shown in FIGS. 4A to 4D.

Subsequently, the semiconductor substrate 31 is accommodated in a wafer boat 35 together with other semiconductor wafers, and the wafer boat 35 is placed in a reactor 36a of a chemical vapor deposition system 36 as shown in FIG. 5. The reactor 36a is connected to a vacuum pump (not shown) and a bubbler 36b, and a nitrogen gas source 36c supplies nitrogen gas to a nozzle 36d inserted into a reservoir tank 36e of the bubbler 36b. The reservoir tank 36e stores tetraethoxy-fluoro-silane 37, and a heater 36f heats the tetraethoxy-fluoro-silane 37.

Figure 4B:
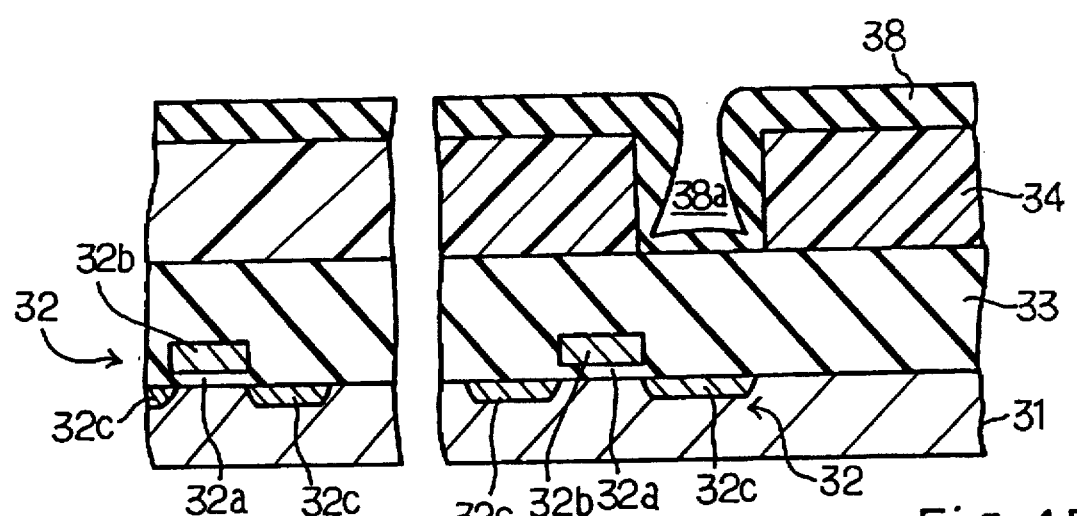

The nitrogen gas bubbles the tetraethoxy-fluoro-silane 37, and vaporizes it in the reservoir tank 36e. The vaporized tetraethoxy-fluoro-silane is guided to the reactor 36a, and silicon oxide is deposited to 150 nanometer thick on the exposed surface of the structure, i.e., the upper surface of the photo-resist layer 34, the inner surface of the photo-resist layer 34 defining the opening 34a and the part of the inter-level insulating layer 33 exposed to the opening 34a. As a result, a silicon oxide layer 38 topographically extends over the exposed surface of the structure, and narrows the opening 34a to a secondary opening 38a as shown in FIG. 4B. The silicon oxide layer 38 serves as a spacer layer, and shrinks the opening 34a.

Figure 4C:
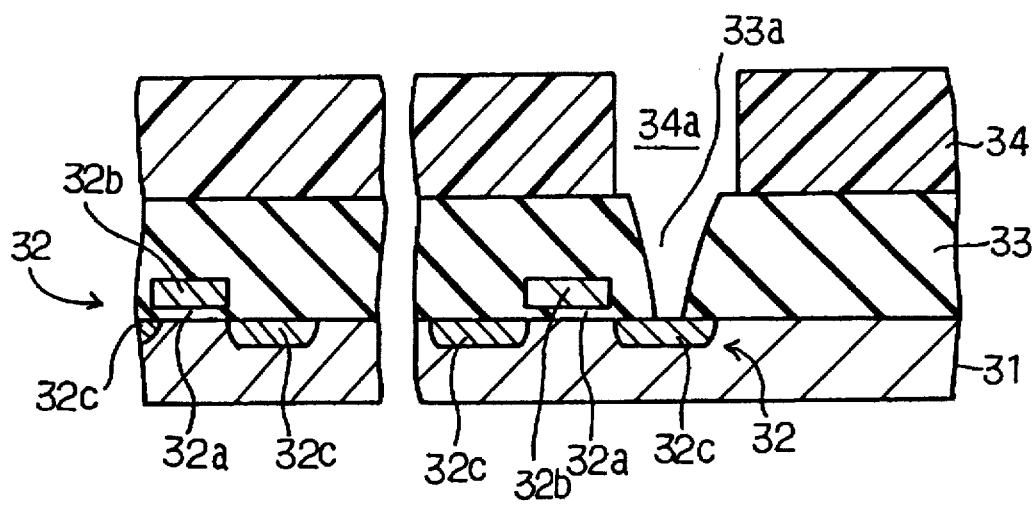

Subsequently, the silicon oxide layer 38 and the inter-level insulating layer 33 are anisotropically etched through a dry etching using a fluorine containing etchant such as, for example, $FC_4$ or $CHF_3$. A contact hole 33a narrower than the opening 34a is formed in the inter-level insulating layer 33, and one of the source and drain regions 32c is exposed to the contact hole 33a as shown in FIG. 4C.

While the silicon oxide layer 38 is being anisotropically etched, the silicon oxide layer 38 remains on the inner surface of the photo-resist layer 34 like a side wall spacer, and the side wall spacer prevents the inter-level insulating layer therebeneath from the etching gas. The side wall spacer is shaped into a taper configuration, and the contact hole 33a is also tapered.

Figure 4D:
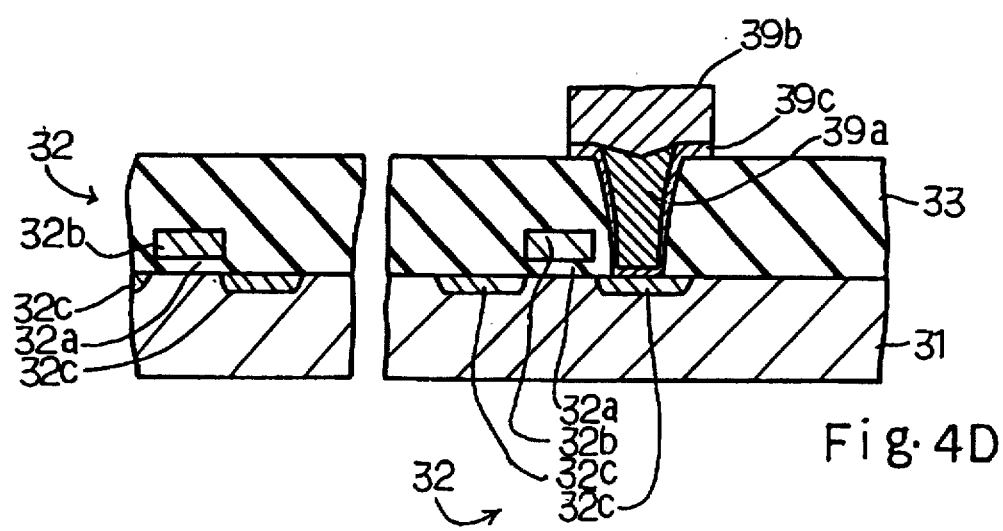

The photo-resist layer 34 is stripped off. Titanium nitride is sputtered on the entire surface of the structure, and the inner surface and the bottom surface defining the contact hole 33a are covered with the titanium nitride layer. Conductive metal such as tungsten or conductive alloy is deposited over the titanium nitride layer, and the contact hole 33a is filled with the conductive metal or the conductive alloy. In this instance, the tungsten is used as the conductive metal/conductive alloy. The tungsten layer is etched back so as to plug the secondary contact hole defined by the tungsten nitride layer. As a result, a tungsten plug 39a fills the secondary contact hole, and is held in contact with one of the source and drain regions 32c. Aluminum or aluminum alloy is deposited over the entire surface of the titanium nitride layer, and a photo-resist mask is formed on the aluminum/aluminum alloy layer. The aluminum/aluminum alloy layer and the titanium nitride layer are patterned into an aluminum wiring 39b and a pad layer 39c of the titanium nitride as shown in FIG. 4D. The aluminum wiring 39b forms a part of aluminum wiring arrangement selectively connecting the field effect transistors 32, and the field effect transistors 32 and the aluminum wiring arrangement as a whole constitute an integrated circuit.

As will be understood from the foregoing description, the silicon oxide layer 38 topographically extending over the photo-resist layer 34 shrinks the photo-resist pattern already transferred to the photo-resist layer 34, and a pattern narrower than the photo-resist pattern is formed in the inter-level insulating layer 33. After pattern transfer to the photo-resist layer 34, the process requires a deposition of silicon oxide and an anisotropical etching only, and the process is surely simplified.

Moreover, the narrower pattern is directly formed in the inter-level insulating layer or the target layer, and the gate electrode 32a is not exposed to the narrow pattern. The silicon oxide layer 38 is topographically deposited over the surface of the photo-resist layer 34, and the opening 38a is not deviated from the opening 34a. Any reactant is not left in the contact hole 33a, and the resistance of the tungsten plug is not undesirably increased.

The contact hole 33a is tapered, and the tungsten plug 39a is snugly received in the secondary contact hole defined by the pad layer 39c. Therefore, the process shown in FIGS. 4A to 4D is desirable for the pattern transfer followed by a sputtering.

Second Embodiment

FIGS. 6A to 6G illustrates another process sequence embodying the present invention. The process sequence starts with preparation of a semiconductor substrate 41, and circuit components (not shown) are fabricated on the semiconductor substrate 41. Only one n-type impurity region 41a is shown in the figures. The semiconductor substrate 41 is overlain by an inter-level insulating layer formed of, for example, silicon oxide, and the inter-level insulating layer 42 is about 1.5 microns in thickness.

Figure 6A:
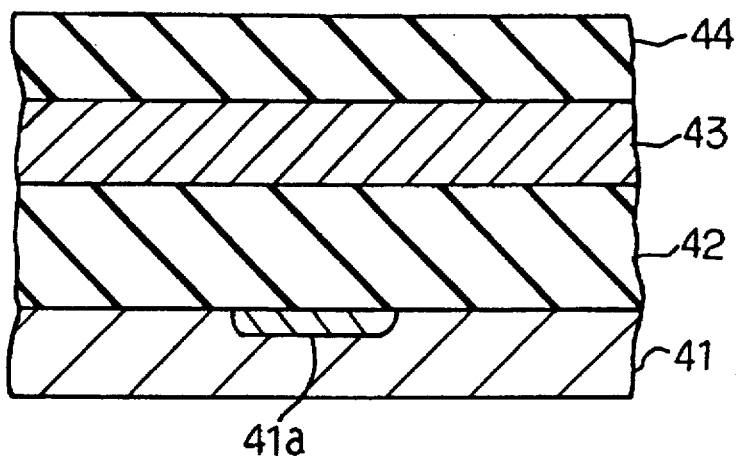
FIGS. 6A to 6G are cross sectional views showing another process sequence according to the present invention.

Polysilicon is deposited on the inter-level insulating layer 42 by using a low-pressure chemical vapor deposition, and silicon oxide is, thereafter, deposited to 1 micron thick on the polysilicon layer 43 by using an atmospheric pressure chemical vapor deposition. As a result, the inter-level insulating layer 42 is overlain by the polysilicon layer 43, and the polysilicon layer 43 is further overlain by a silicon oxide layer 44 as shown in FIG. 6A.

Photo-resist solution is spun onto the silicon oxide layer 44, and is spread over the entire surface. The photo-resist is baked, and the silicon oxide layer 44 is covered with a photo-resist layer 45. The photo-resist layer 45 is equal in thickness to the silicon oxide layer 44, and is about 1 micron thick in this instance. The inter-level insulating layer 42 is much thicker than the photo-resist layer 45.

Figure 6B:
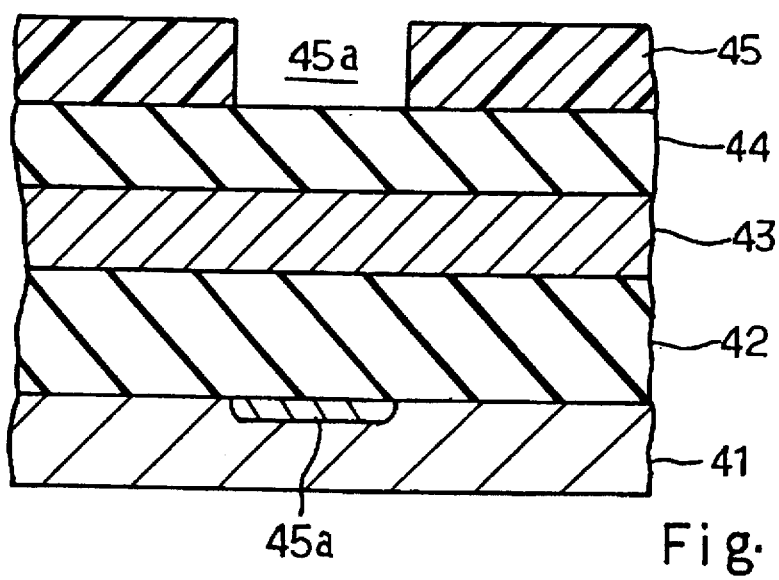

The resultant structure is placed in an aligner (not shown), and a pattern is transferred from a reticle (not shown) to the photo-resist layer 45 through an optical illumination. A developing solution is applied to the photo-resist layer 45, and the pattern is developed in the photo-resist layer 45. In this instance, the pattern has an opening 45a, and the silicon oxide layer 44 is partially exposed to the opening 45a as shown in FIG. 6B.

Figure 6C:
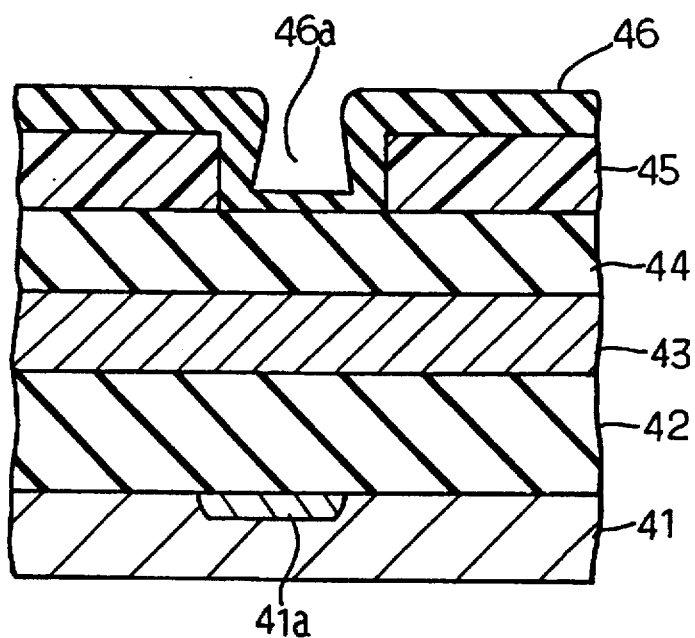

Silicon oxide is deposited on the exposed surface of the structure at not higher than 130 degrees centigrade in a reactor of an atmospheric pressure chemical vapor deposition system as similar to the silicon oxide layer 38. The tetraethoxy-fluoro-silane is used for the deposition of the silicon oxide. The silicon oxide layer 46 topographically extends on the upper surface of the photo-resist layer 45, the inner surface defining the opening 45a and the exposed surface of the silicon oxide layer 44, and defines a secondary opening 46a narrower than the opening 45a as shown in FIG. 6C.

Figure 6D:
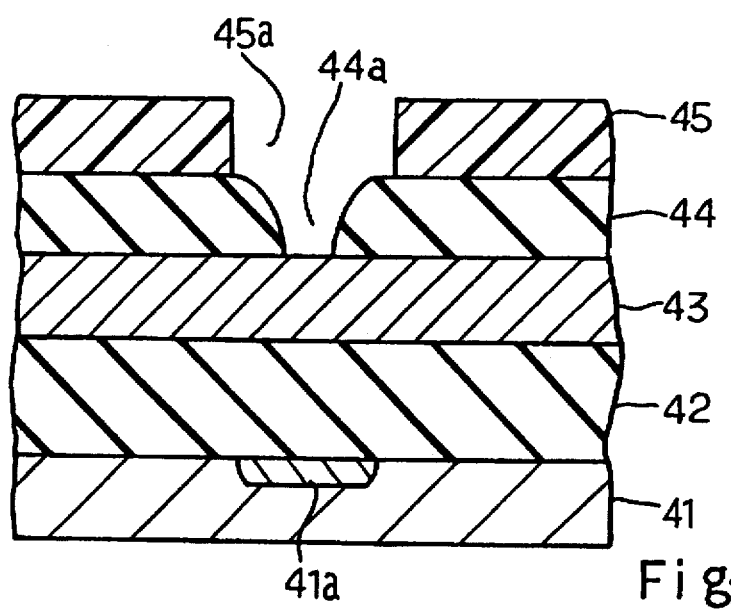

The silicon oxide layers 46 and 44 are subjected to an anisotropical dry etching using a fluorine-containing etchant gas, and an opening 44a is formed in the silicon oxide layer 44. While the fluorine-containing etchant gas is anisotropically etching the silicon oxide layer 46, a side wall spacer is left on the inner surface of the photo-resist layer 45, and makes the opening 44a narrower than the opening 45a as shown in FIG. 6D. The opening 44a is tapered, and the cross section is downwardly decreased.

Figure 6E:
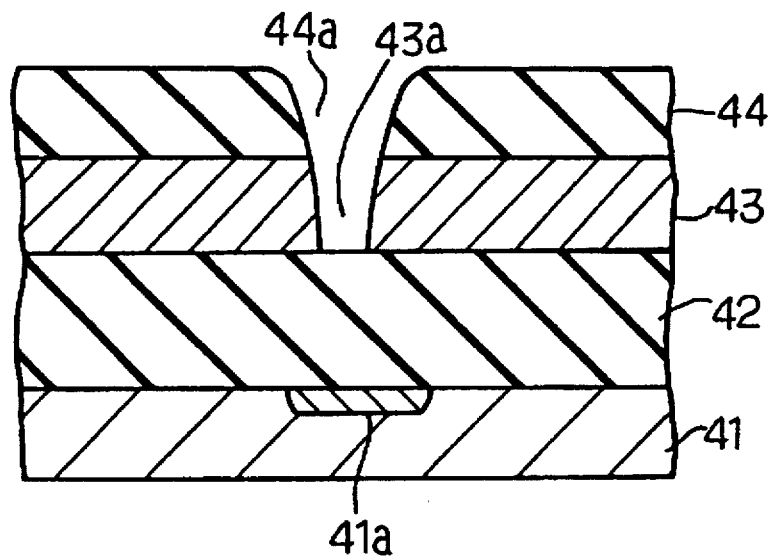

The photo-resist layer 45 is stripped off from the structure, and the silicon oxide layer 44 is exposed. Using the silicon oxide layer 44 as an etching mask, the polysilicon layer 43 is anisotropically etched, and an opening 43a is formed in the polysilicon layer 43 as shown in FIG. 6E.

Figure 6F:
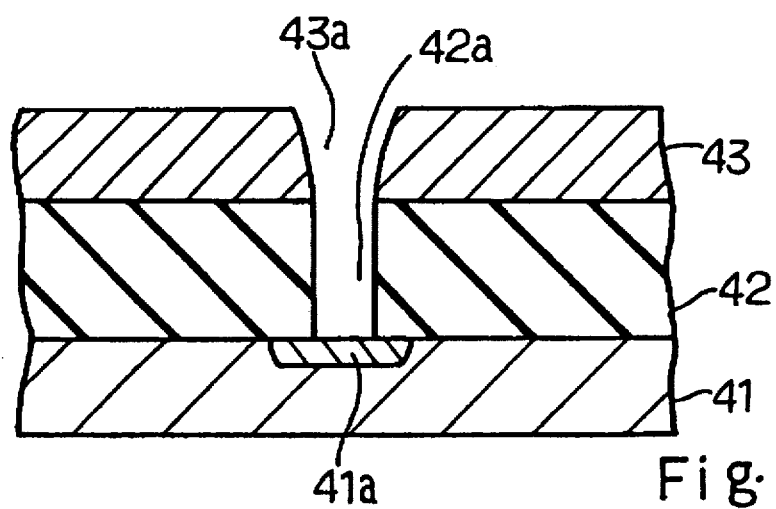

Subsequently, the silicon oxide layer 44 and the inter-level insulating layer 42 are anisotropically etched by using the fluorine-containing etchant gas. The polysilicon layer 43 serves as an etching mask, and a contact hole 42a is formed in the inter-level insulating layer 42 as shown in FIG. 6F. The contact hole 42a is not tapered, because the polysilicon layer 43 serves as the etching mask. The n-type impurity region 41a is exposed to the contact hole 42a.

Figure 6G:
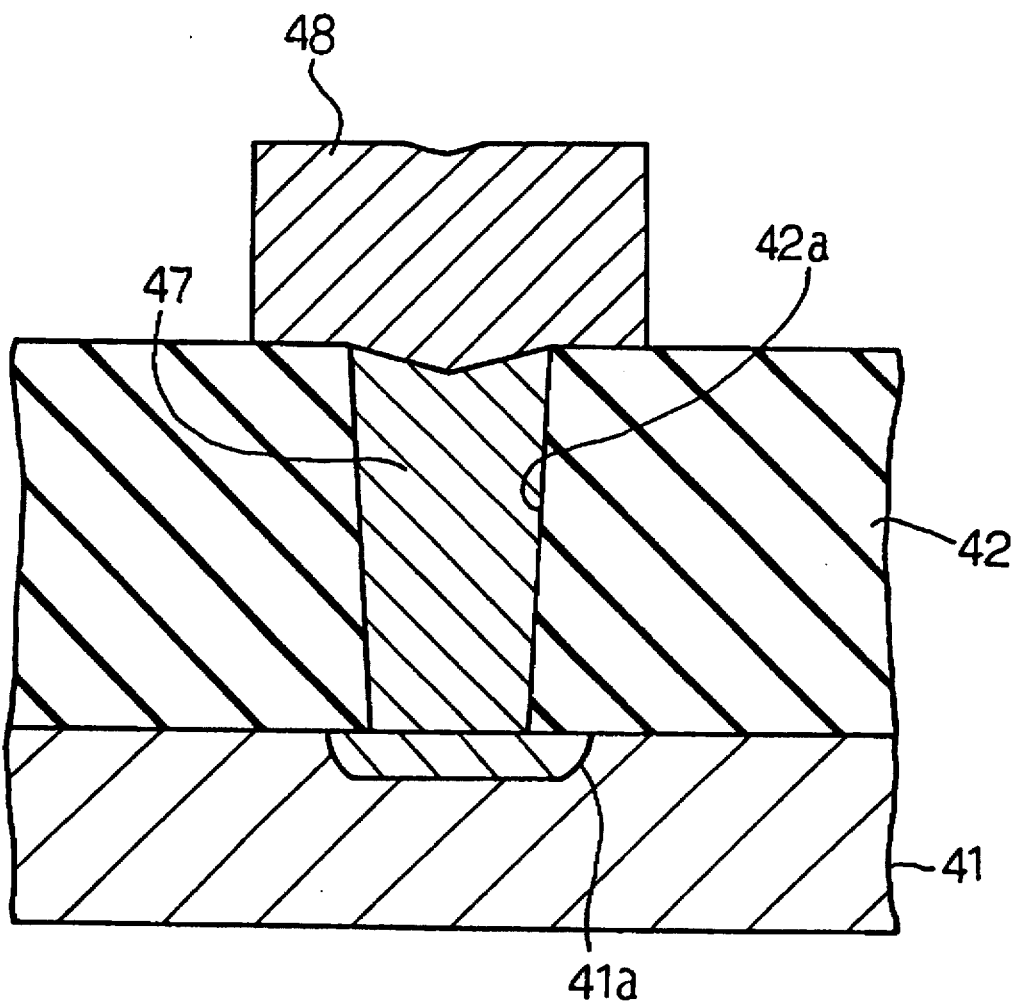

Phosphorous-doped polysilicon is deposited over the entire surface of the resultant structure by using a low-pressure chemical vapor deposition. The contact hole 43a is filled with the phosphorous-doped polysilicon, and the upper surface of the inter-level insulating layer 42 is covered with the phosphorous-doped polysilicon. The phosphorous-doped polysilicon layer is etched back or uniformly etched until the inter-level insulating layer 42 is exposed, and the phosphorous-doped polysilicon plug 47 is left in the contact hole 42a. The phosphorous is activated through a heat treatment, and conductive metallic compound such as tungsten silicide is deposited over the entire surface of the structure by using a sputtering. The tungsten silicide layer is patterned by using a lithography and an etching, and a conductive wiring 48 is formed on the inter-level insulating layer 42 as shown in FIG. 6G. The conductive wiring 48 is held in contact with the phosphorous-doped plug 47, and provides an electrical connection between the n-type impurity region and another circuit component of the integrated circuit.

In the second embodiment, even if the inter-level insulating layer is widely different in thickness from the photo-resist layer 45, the resist pattern is shrunk during the pattern transfer from the photo-resist layer 45 to the silicon oxide layer 44, and the small geometry contact hole 42a is formed in the inter-level insulating layer 42 regardless of the thickness thereof. In this instance, the silicon oxide layer 46 is a spacer layer, and the silicon oxide layer 44 is a target layer.

The process implementing the second embodiment achieves all the advantages of the first embodiment. As described hereinbefore, the vertical inner surface defines the non-tapered contact hole 42a. If a conductive layer is embedded in the inter-level insulating layer 42 in close relation to the contact hole, a taper contact hole is liable to expose the conductive layer thereto. However, the vertical contact hole 42a does not occupy an additional area, and leaves the conductive layer isolated.

Although particular embodiments of the present invention have been shown and described, it will be obvious to those skilled in the art that various changes and modifications may be made without departing from the spirit and scope of the present invention.

For example, the photo-resist pattern may be used for an ion implantation or another selective process stage.

Although silicon oxide forms the spacer layer in the embodiments, the spacer layer is not limited to the same substance as the target layer. The following conditions are expected to the spacer layer. First, the spacer layer is formed on a photo-resist layer in the atmospheric pressure at not higher than 130 degrees centigrade. Second, the spacer layer is good in step coverage. Finally, there is an anisotropical etchant having little selectivity between the substance of the spacer layer and the substance of the target layer.

What is claimed is:

1. A process of fabricating a semiconductor device, comprising the steps of:
   a) preparing a target layer of first material to be patterned;
   b) forming a photo-resist layer on said target layer;
   c) transferring a pattern to said photo-resist layer so as to form at least one first opening defined by an inner surface of said photo-resist layer and exposing a part of said target layer;
   d) depositing a spacer layer of second material so as to cover an upper surface of said photo-resist layer, said inner surface of said photo-resist layer and said part of said target layer, said spacer layer defining a cavity narrower than said at least one opening; and
   e) exposing said spacer layer and said target layer to a first anisotropical etchant having little selectivity between said first material and said second material so as to etch said spacer layer and said target layer by a continuous etching process in a single process step and form a second opening in said target layer smaller in area than said at least one first opening.

2. The process as set forth in claim 1, in which said first material and said second material are silicon oxide.

3. The process as set forth in claim 2, in which said silicon oxide is deposited through an atmospheric pressure chemical vapor deposition using tetraethoxy-fluoro-silane in said step d).

4. The process as set forth in claim 1, in which a thickness of said photo-resist layer is close to a thickness of said target layer.

5. The process as set forth in claim 1, in which said target layer is laminated on a mask layer of a third material, and said mask layer is laminated on a patternable layer of a fourth material, said first anisotropical etchant having a large selectivity between said third material and said second material, said process further comprising the steps of:
   f) removing said photo-resist layer;
   g) anisotropically etching said mask layer by using said target layer as an etching mask so as to form a third opening not wider than said second opening and exposing a part of said patternable layer; and
   h) exposing at least said part of said patternable layer to a second anisotropical etchant having a large selectivity between said third material and said fourth material so as to form a fourth opening in said patternable layer.

6. The process as set forth in claim 5, in which said first material, said second material and said fourth material are silicon oxide, and said third material is polysilicon.

7. A process of fabricating a semiconductor device, comprising the steps of:
   a) preparing a semiconductor substrate overlain by a inter-level insulating layer of silicon oxide;
   b) forming a photo-resist layer approximately equal in thickness to said inter-level insulating layer on said inter-level insulating layer;
   c) transferring a pattern image to said photo-resist layer so as to form a first opening in said photo-resist layer;
   d) depositing a spacer layer of silicon oxide through an atmospheric pressure chemical vapor deposition using tetraethoxy-fluoro-silane so as to cover an upper surface of said photo-resist layer, an inner surface of said photo-resist layer defining said first opening and a part of said inter-level insulating layer exposed to said first opening therewith, said spacer layer defining a second opening narrower than said first opening; and
   e) anisotropically etching said spacer layer and said part of said inter-level insulating layer by a continuous etching process in a single process step, so as to form a contact hole in said inter-level insulating layer which is narrower than said first opening.

8. A process of fabricating a semiconductor device, comprising the steps of:
   a) preparing a multi-level structure on a semiconductor substrate, said multi-level structure having an inter-level insulating layer of silicon oxide laminated on said semiconductor substrate, a polysilicon layer laminated on said inter-level insulating layer and a first silicon oxide layer laminated on said polysilicon layer;
   b) forming a photo-resist layer approximately equal in thickness to said first silicon oxide layer and laminated on said first silicon oxide layer;
   c) transferring a pattern image on said photo-resist layer so as to form a first opening in said photo-resist layer;
   d) depositing a second silicon oxide layer through an atmospheric pressure chemical vapor deposition using tetraethoxy-fluoro-silane so as to cover an upper surface of said photo-resist layer, an inner surface of said photo-resist layer defining said first opening and a part of said first silicon oxide layer exposed to said first opening therewith, said second silicon oxide layer defining a second opening narrower than said first opening;
   e) anisotropically etching said second silicon oxide layer and said part of said first silicon oxide layer by a continuous etching process in a single process step, so as to form a third opening in said first silicon oxide layer which is narrower than said first opening, a part of said polysilicon layer being exposed to said third opening;
   f) removing said photo-resist layer;
   g) anisotropically etching said part of said polysilicon layer so as to form a fourth opening narrower than said first opening in said polysilicon layer, a part of said inter-level insulating layer being exposed to said fourth opening;
   h) anisotropically etching said part of said inter-level insulating layer so as to form a fifth opening narrower than said first opening in said inter-level insulating layer; and
   i) removing said polysilicon layer.

9. The process as set forth in claim 1, wherein said step of depositing said spacer layer is performed at no higher than 130 degrees centigrade.

10. The process as set forth in claim 1, wherein a type of material used for said first and said second material is selected so as to enable a single anisotropic etchant to be used for said anisotropical etchant having little selectivity between said first and said second material.

11. The process as set forth in claim 1, wherein said target layer is an inter-level insulating layer into which said second opening is formed, and said process further comprises the step of:

forming a conductive material in said second opening, said conductive material being a contact plug between an area of said semiconductor substrate and a conductive layer formed over said inter-level insulating layer.

12. The process as set forth in claim 1, wherein said first anisotropical etchant contains fluorine.

13. The process as set forth in claim 7, wherein said step of depositing said spacer layer is performed at no higher than 130 degrees centigrade.

14. The process as set forth in claim 7, further comprising the step of:

forming a conductive material in said contact hole, said conductive material being a contact plug between an area of said semiconductor substrate and a conductive layer formed over said inter-level insulating layer.

15. The process as set forth in claim 7, wherein said step of anisotropically etching said second silicon oxide layer and said part of said inter-level insulating layer is performed with an etchant containing fluorine.

16. The process as set forth in claim 8, wherein said step of depositing said second silicon oxide layer is performed at no higher than 130 degrees centigrade.

17. The process as set forth in claim 8, wherein said step of anisotropically etching said second silicon oxide layer and said part of said first oxide layer is performed with an etchant containing fluorine.

* * * * *